United States Patent [19]

Fry et al.

[11] Patent Number: 5,160,807

[45] Date of Patent: Nov. 3, 1992

[54] METHOD FOR RFI/EMI PROTECTION OF ELECTRONIC CIRCUITRY

[75] Inventors: John J. Fry, Wickliffe; George R. Hall, II, Geneva, both of Ohio

[73] Assignee: Elsag International B.V., Netherlands

[21] Appl. No.: 743,481

[22] Filed: Aug. 8, 1991

[51] Int. Cl.$^5$ .............................................. H05K 9/00
[52] U.S. Cl. .............................. 174/35 R; 174/35 MS; 361/424
[58] Field of Search ............. 361/400, 424; 174/35 R, 174/35 MS, 35 TS; 219/10.55 D, 10.55 R; 333/243, 244

[56] References Cited

U.S. PATENT DOCUMENTS

| | | | |
|---|---|---|---|
| 3,407,261 | 10/1968 | Donath et al. | 174/35 R |
| 4,370,515 | 3/1983 | Donaldson | 174/35 R |
| 5,014,160 | 5/1991 | McCoy, Jr. | 361/424 |

Primary Examiner—Leo P. Picard
Assistant Examiner—Bot Lee Ledynh
Attorney, Agent, or Firm—Vytas R. Matas; Robert J. Edwards

[57] ABSTRACT

An arrangement for providing radio frequency and electromagnetic interference protection to at least part of circuitry mounted on a circuit board comprises alternating slots and bridges which form a boundary between a protected area of the circuit board and an unprotected area of the circuit board. The circuit portions which require protection are mounted in the protected area and are covered by a top cover having fingers which extend through the slots. Connecting lines between the protected and unprotected portions of the circuit portions extend along the bridges between the slots. A bottom cover engages under the protected area and mates to the top cover for providing electromagnetic interference protection for the circuit portions within the protected area.

14 Claims, 3 Drawing Sheets

METHOD FOR RFI/EMI PROTECTION OF ELECTRONIC CIRCUITRY

FIELD AND BACKGROUND OF THE INVENTION

The present invention relates in general to interference protection for electronic circuitry, and in particular, to a new and useful method and apparatus for protecting parts of an electronic circuit from both radio frequency and electromagnetic interference.

Existing methods for providing RFI (radio frequency interference) protection for an electronic circuit usually require the use of separate shielded enclosure, separate circuit boards, and the use of discrete filter elements. The separate circuit board is normally mounted in its own shielded enclosure. The inputs and outputs to this circuit pass through RFI/EMI (electromagnetic interference) filters which are typically mounted to a wall of the enclosure. These lines are generally connected to a second, unshielded circuit board in a separate enclosure which contains means for connection to external wiring.

SUMMARY OF THE INVENTION

The purpose of the present invention is to provide RFI and EMI protection to a portion of an electronic circuit where the entire circuit, including RFI filters and external connections, is mounted on a single circuit board in a single enclosure.

The portion of the circuit which requires RFI protection is located in one area of the circuit board. Portions of the circuit which do not require RFI protection are mounted in another area of the same circuit board. The circuitry which requires RFI protection is isolated from the remainder of the circuit board by a series of slots with input and output lines entering and exiting through bridges between the slots. Top and bottom metal covers enclose the protected circuit by extending fingers of metal which extend through the slots. The amount of overlap and the spacing between the finger are sized so as to attenuate electromagnetic energy waves below a certain frequency from entering the covers. The relative size of the bridges and slots are also sized so that the aperture size and spacings attenuate electromagnetic energy. The covers are grounded to the circuit board.

Each circuit line which enters the protected area is conducted through an RFI filter which is mounted as near as possible to the bridge. The RFI filters are standard electronic components which are soldered to the circuit board during the course of the assembly process.

An additional function of the covers is to dissipate heat generated by electronic components within the protected area.

The primary advantage and object of the invention is that it provides RFI protection using only one printed circuit board. Thus, the need for a connector or connectors between two circuit boards is eliminated. RFI protection is provided by standard components which are installed on the board as part of the standard assembly process, and no additional wiring is required.

Another advantage is that the need for a second environmentally sealed enclosure is eliminated. The entire electronic circuit is mounted within an enclosure which does not provide RFI protection. The RFI cover functions as a second enclosure which provides the requisite shielding function for those portions of the circuit which require RFI protection. The shielding structure itself therefore does not provide significant mechanical rigidity or environmental protection.

The area which requires RFI protection may be located near a corner of the circuit board, in the center of the board or in another area of the circuit board. The bridge width and separation is selected based on the number of circuit connections and the physical size of the assembly. Improved performance can be obtained by reducing the bridge widths and increasing the separation between bridges. Performance could also be improved by using high permeability metal for the covers in place of sheet steel.

A further object of the present invention is to provide both RFI and EMI protection for at least part of the circuitry on a single circuit board, which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
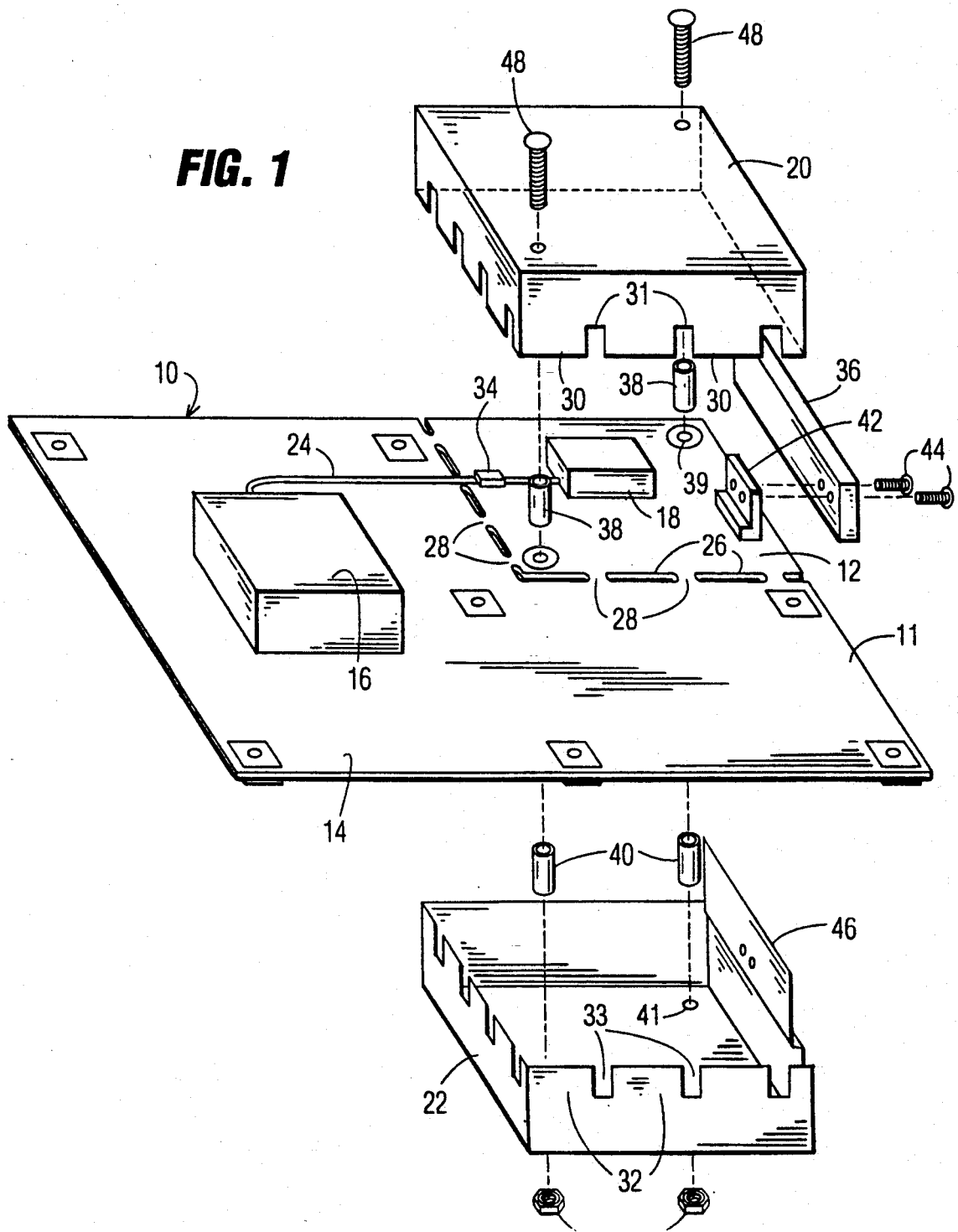
FIG. 1 is a perspective exploded view of the interference protection arrangement of the present invention.

Referring to the drawings in particular, the invention embodied in FIG. 1 comprises an arrangement for providing RFI and EMI protection for a circuit portion schematically shown at 18, which is mounted on a circuit board generally designated 10 that also carries at least one circuit portion 16 which does not require interference protection. Many separate components on circuit board 10 are represented by circuit portions 16 and 18.

Figure 3:
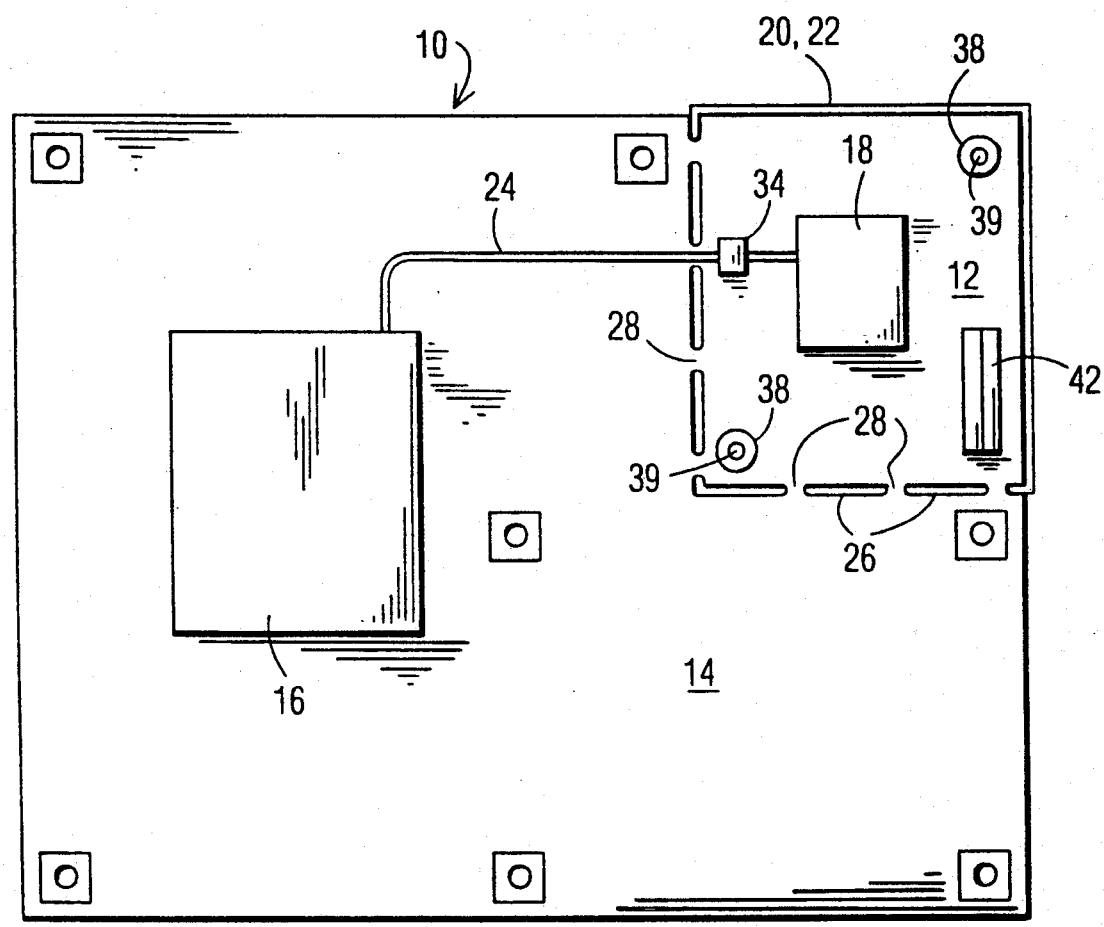
FIG. 3 is a top plan view of the circuit board provided with the interference protection arrangement of the present invention which is shown in part only.

Circuit board 10 is divided into a protected area 12 at one corner of the circuit board, and a remaining unprotected area 14. The boundary between the protected area 12 and the unprotected area 14 is provided with a plurality of slots 26 which extend through the circuit board 10 as best shown in FIG. 3. Bridges 28 are provided between the slots 26 on both sides of the protected area 12 which border the remaining area 14. Typically, each slot is 0.927 inches long and each bridge is 0.180 inches long. The slots must also be wide enough to receive two thicknesses of the sheet metal used to construct covers to be described later.

Input and/or output lines 24 between the circuit portions 16 and 18 extend along one of the bridges 28 and include an RFI filter 34 positioned as close to the bridge as possible. Although only one line is shown, several lines may extend across the various bridges.

Figure 2:
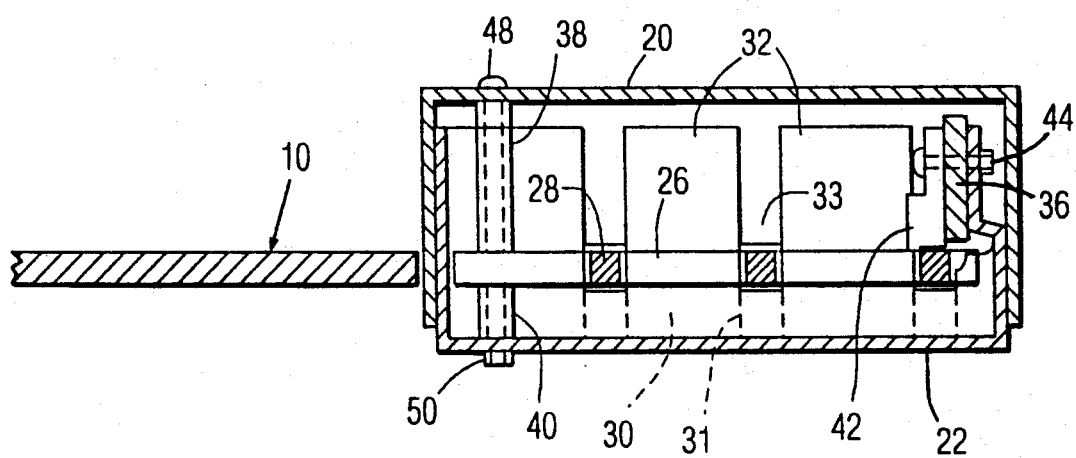
FIG. 2 is a partial sectional view of the assembled arrangement with part of the bottom cover cut away.

To provide EMI protection, an upper cover 20 and a lower cover 22 enclose the upper and lower surfaces of protected circuit board area 12. Upper or top cover 20 is downwardly open and includes two edges which have projecting fingers 30 separated by recesses 31. Typically each finger 30 is 0.882 inches wide and the recesses 31 are 0.226 inches wide. Fingers 31 engage into the respective slots 26 with the recesses 31 engaging over the respective bridges 28. With the fingers 30 engaged through the slots of the circuit board, a space of approximately 0.700 inches high above area 12 is enclosed by the top cover 20. The bottom cover 22 also includes fingers 32 separated by recesses 33 which are sized to be approximately the same as the fingers and recesses of top cover 20. The bottom cover 22 is engaged upwardly through the slots 26 and inwardly of the top cover 20 as best shown in FIG. 2, to completely enclose the protected circuit board area 12. A grounding tab 46 extends around the outer edge 11 of circuit board 10 and against a grounding and heat sink plate 42 soldered or otherwise permanently attached to the upper surface of circuit board 10 in area 12. Tab 46 forms one side of bottom cover 22. An aluminum heat sink plate 36 which is approximately 4.06 inches long, 0.68 inches high and 0.09 inches thick, is fixed by screws 44 between tab 46 and grounding plate 42.

The cover 20 is grounded to the circuit board 10 through conductive spacers 38 which align with holes 39, lower spacers 40 and holes 41 in bottom cover 22, to fix the top and bottom covers to the circuit board using screws 48 and nuts 50. Covers 20, 22 can be made of sheet steel or high permeability metal.

While a specific embodiment of the invention has been shown and described in detail to illustrate the application of the principles of the invention, it will be understood that the invention may be embodied otherwise without departing from such principles.

What is claimed is:

1. A radio frequency and electromagnetic interference protection arrangement for a circuit board carrying at least one protected circuit portion requiring radio frequency and electromagnetic interference protection, and an unprotected circuit portion, comprising:

a circuit board having a protected area carrying the protected circuit portion and an unprotected area carrying the unprotected circuit portion, the circuit board including at least one alternating slot and bridge forming a boundary between the protected area and the unprotected area;

a downwardly open top cover having at least one finger and at least one recess for engaging over the protected area, the finger being engageable into the slot and the recess being engageable over the bridge;

an upwardly open bottom cover for engagement under the protected area, the bottom cover including at least one finger and at least one recess, the finger of the bottom cover extending upwardly through the slot and the recess of the bottom cover extending under the bridge;

at least one connecting line connected between the protected and unprotected circuit portions, the line extending along the bridge; and means for grounding the top and bottom covers to the circuit board.

2. An arrangement according to claim 1 wherein said means for grounding includes a grounding plate fixed to an upper surface of the circuit board in the protected area, the bottom cover including a tab extending above the circuit board and fixed to the grounding plate 3. An arrangement according to claim 1, including a radio frequency interference filter connected in the line immediately adjacent the bridge on which the line extends and in the protected area.

4. An arrangement according to claim 1 wherein the circuit board is rectangular, the protected area being rectangular and occupying a corner of the circuit board, the boundary between the protected and unprotected areas having two sides containing additional alternating slots and recesses, with two remaining sides of the protected area comprising edges of the circuit board.

5. An arrangement according to claim 1 wherein said means comprise aligned holes in the top cover, in the circuit board and in the bottom cover, and upper and lower spacers aligned with the holes, and a rod extending through the aligned holes and spacers and fixing the covers to each other and to the circuit board.

6. An arrangement according to claim 2, including a heat sink element connected to and in thermal contact with the bottom cover and the grounding plate 7. An arrangement according to claim 1, including heat sink means operatively connected between at least one of the covers and the circuit board for dissipating heat from the circuit board and to one of the covers.

8. An arrangement according to claim 1, wherein the boundary between the protected and unprotected areas include a plurality of alternating slots and bridges, the top and bottom covers each including a plurality of alternating fingers and recesses for engaging the slots and bridges.

9. An arrangement according to claim 8, wherein the covers are made of sheet steel.

10. An arrangement according to claim 8, wherein the covers are made of high permitivity metal.

11. An arrangement according to claim 1, wherein the covers are made of sheet steel.

12. An arrangement according to claim 11, wherein the covers are made of high permitivity metal.

13. An arrangement according to claim 1, wherein the finger of the bottom cover engage an inner surface of the finger of the top cover.

14. An arrangement according to claim 13 including a radio frequency interference filter connected in the connecting line, and mounted on the circuit board in a protected area adjacent the slot.

* * * * *